US012787804B2

(12) United States Patent
Koi

(10) Patent No.: US 12,787,804 B2
(45) Date of Patent: Nov. 3, 2026

(54) ELECTRONIC APPARATUS

(71) Applicant: SHINKO ELECTRIC INDUSTRIES CO., LTD., Nagano (JP)

(72) Inventor: Kenichi Koi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 313 days.

(21) Appl. No.: 18/545,757

(22) Filed: Dec. 19, 2023

(65) Prior Publication Data

US 2024/0222256 A1 Jul. 4, 2024

(30) Foreign Application Priority Data

Dec. 28, 2022 (JP) ................................ 2022-212252

(51) Int. Cl.
*H01L 23/498* (2006.01)
*H01L 23/00* (2006.01)
(Continued)

(52) U.S. Cl.
CPC ......... *H10W 70/479* (2026.01); *H10W 70/65* (2026.01); *H10W 74/114* (2026.01);
(Continued)

(58) Field of Classification Search
CPC ............... H10W 70/479; H10W 70/65; H10W 74/114; H10W 90/00; H10W 72/856;
(Continued)

(56) References Cited

U.S. PATENT DOCUMENTS

| | | | | |
|---|---|---|---|---|
| 2006/0044772 | A1 | 3/2006 | Miura | |
| 2013/0148314 | A1 | 6/2013 | Hirai et al. | |
| 2015/0084207 | A1* | 3/2015 | Chauhan | H10W 70/614 438/118 |
| 2015/0380356 | A1 | 12/2015 | Chauhan et al. | |
| 2019/0304910 | A1* | 10/2019 | Fillion | H03K 19/017545 |

FOREIGN PATENT DOCUMENTS

| | | | |
|---|---|---|---|
| JP | 2006-73655 | A | 3/2006 |
| JP | 2009-224529 | A | 10/2009 |

(Continued)

OTHER PUBLICATIONS

Japanese Decision to Grant a Patent mailed Jul. 7, 2026 issued in corresponding Japanese application No. 2022-212252; English translation included (3 pages).

*Primary Examiner* — Tong-Ho Kim
(74) *Attorney, Agent, or Firm* — Rankin, Hill & Clark LLP

(57) ABSTRACT

An electronic apparatus includes a first metal layer, a component mounting substrate, a second metal layer, and sealing resin. The first metal layer includes a first mounting portion and a second mounting portion. The component mounting substrate includes an electronic component mounted on the first mounting portion. The second metal layer is arranged on the first metal layer such that the second metal layer and the second mounting portion sandwich a driving component. The sealing resin fills a space between the first metal layer and the second metal layer, covers the component mounting substrate, and seals the electronic component and the driving component. The first metal layer includes a terminal portion that protrudes from the first mounting portion toward the second metal layer. The second metal layer includes a wire portion that comes into contact with the terminal portion and connects the second metal layer to the first mounting portion.

6 Claims, 18 Drawing Sheets

(51) Int. Cl.

| | |
|---|---|
| ***H01L 23/31*** | (2006.01) |
| ***H01L 25/065*** | (2023.01) |
| ***H01L 25/16*** | (2023.01) |
| ***H10W 70/40*** | (2026.01) |
| ***H10W 70/65*** | (2026.01) |
| ***H10W 74/10*** | (2026.01) |
| ***H10W 90/00*** | (2026.01) |
| *H10W 72/00* | (2026.01) |
| *H10W 74/00* | (2026.01) |

(52) U.S. Cl.

CPC .......... *H10W 90/00* (2026.01); *H10W 72/856* (2026.01); *H10W 72/877* (2026.01); *H10W 74/00* (2026.01); *H10W 90/726* (2026.01); *H10W 90/734* (2026.01); *H10W 90/736* (2026.01)

(58) Field of Classification Search

CPC ............... H10W 72/877; H10W 74/00; H10W 90/726; H10W 90/734; H10W 90/736; H10W 72/30; H10W 72/20; H10W 72/851

USPC .......................................................... 257/678

See application file for complete search history.

(56) References Cited

FOREIGN PATENT DOCUMENTS

| | | | |
|---|---|---|---|
| JP | 2011-23654 | A | 2/2011 |
| JP | 2015-70269 | A | 4/2015 |
| JP | 2021-40113 | A | 3/2021 |
| WO | 2013/001999 | A1 | 1/2013 |

* cited by examiner

ELECTRONIC APPARATUS

CROSS-REFERENCE TO RELATED APPLICATION

This application is based upon and claims the benefit of priority of the prior Japanese Patent Application No. 2022-212252, filed on Dec. 28, 2022, the entire contents of which are incorporated herein by reference.

FIELD

The embodiment discussed herein is related to an electronic apparatus.

BACKGROUND

In recent years, an electronic apparatus that connects a substrate, in which an electronic component, such as a semiconductor chip, is mounted on a wiring board, and another substrate, on which a driving component, such as an Integrated Circuit (IC) chip, for driving the electronic component is mounted, by a wiring member, such as a wire, is known.

Patent Literature 1: International Publication Pamphlet No. 2013/001999

However, in the electronic apparatus that connects, by the wiring member, the substrate on which the electronic component is mounted and the substrate on which the driving component is mounted, there is a problem in that it is difficult to drive the electronic component at high speed. Specifically, when the two independent substrates are connected to each other by the wiring member, a wire length between the electronic component on one of the substrates and the driving component on the other one of the substrates increases due to drawing of the wiring member, so that a defect, such as an increase in inductance or an increase in noise, occurs. As a result, high-speed driving of the electronic component by the driving component may be disturbed.

SUMMARY

According to an aspect of an embodiment, an electronic apparatus includes a first metal layer that includes a first mounting portion and a second mounting portion; a component mounting substrate that includes a wiring board and an electronic component that is mounted on the wiring board, the electronic component being mounted on the first mounting portion; a second metal layer that is bonded to a driving component and that is arranged on the first metal layer such that the second metal layer and the second mounting portion sandwich the driving component; and sealing resin that fills a space between the first metal layer and the second metal layer, covers the component mounting substrate, and seals the electronic component and the driving component, wherein the first metal layer includes a terminal portion that protrudes from the first mounting portion toward the second metal layer, and the second metal layer includes a wire portion that comes into contact with the terminal portion and electrically connects the second metal layer to the first mounting portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

An embodiment of an electronic apparatus disclosed in the present application will be described in detail below based on the drawings. The disclosed technology is not limited by the embodiment below.

Figure 1A:
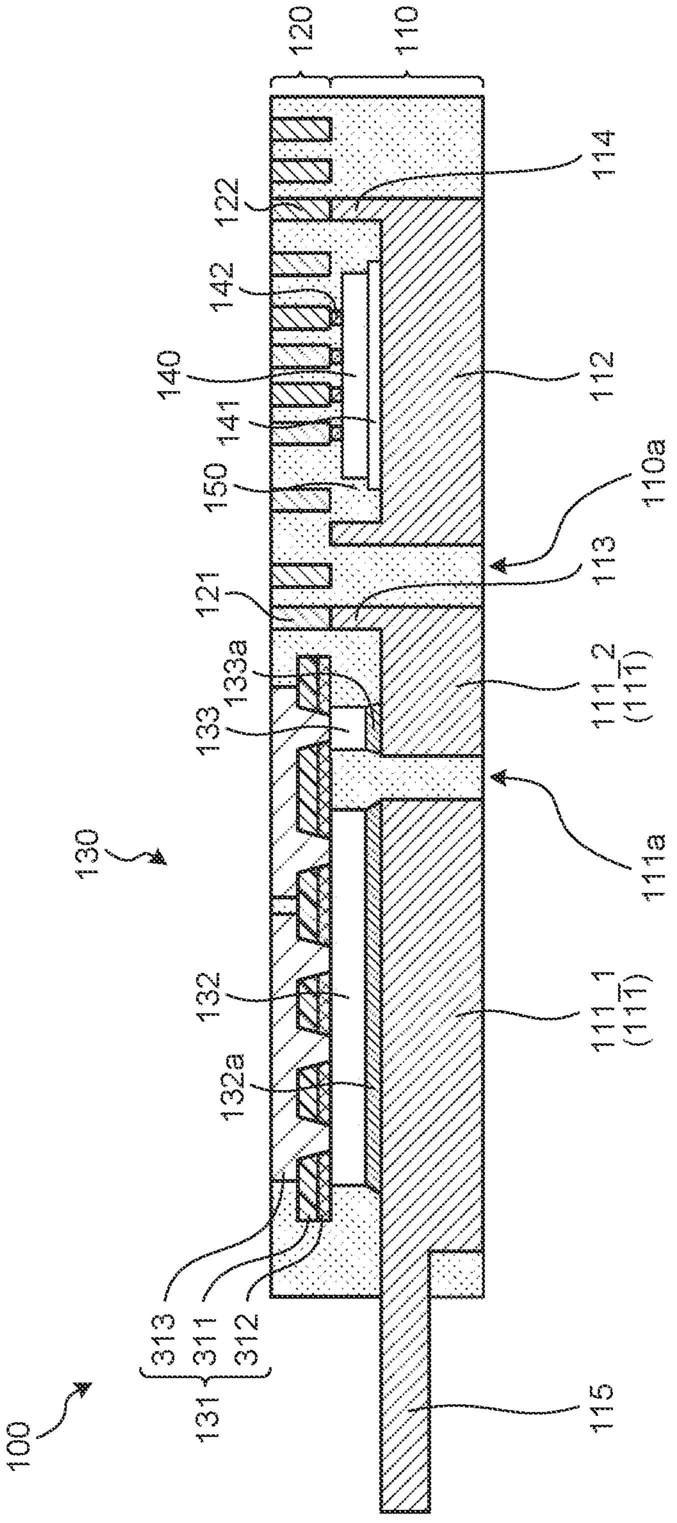
FIG. 1A is a schematic cross-sectional view illustrating a configuration of an electronic apparatus according to one embodiment.
Figure 1B:
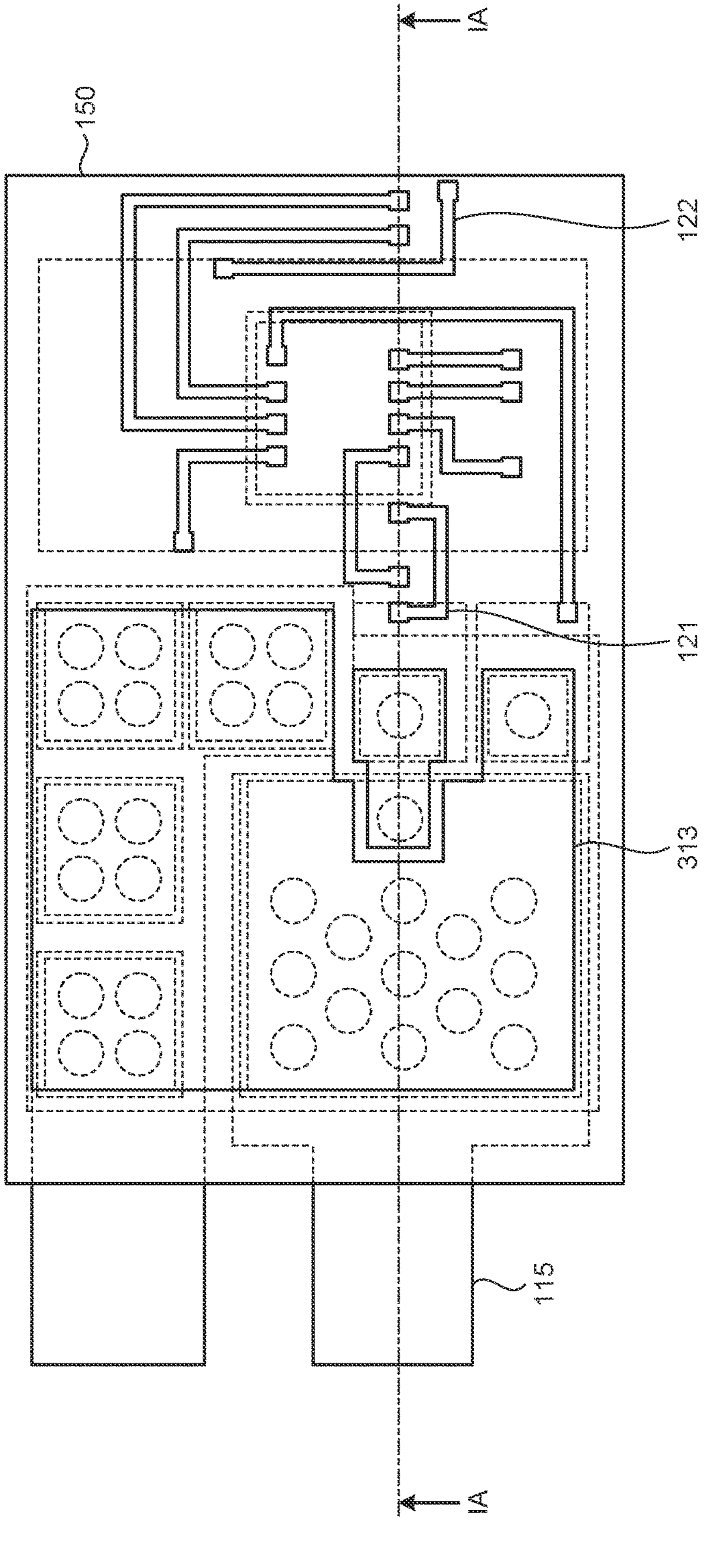
FIG. 1B is a schematic top plan view of the electronic apparatus according to one embodiment.

FIG. 1A is a schematic cross-sectional view illustrating a configuration of an electronic apparatus 100 according to one embodiment. FIG. 1B is a schematic top plan view of the electronic apparatus according to one embodiment. FIG. 1A schematically shows a cross section along an IA-IA line of FIG. 1B. Meanwhile, in the following, a surface of the electronic apparatus 100 that is located at the side of a passive component, such as an inductor, when the passive component is mounted will be referred to as an "upper surface", a surface located opposite to the passive component will be referred to as a "lower surface", and a vertical direction is defined in accordance with the upper surface and the lower surface, for example. However, the electronic apparatus 100 may be manufactured and used upside down and may be manufactured and used in an arbitrary posture, for example.

The electronic apparatus 100 illustrated in FIG. 1A and FIG. 1B. includes, on an upper surface of a first metal layer 110, a semiconductor chip 132 and a conductive member 133 of a component mounting substrate 130. Further, the electronic apparatus 100 includes an IC chip 140, which drives the semiconductor chip 132, between the first metal layer 110 and a second metal layer 120, and is entirely subjected to resin sealing with sealing resin 150.

The semiconductor chip 132 is a semiconductor element using, for example, silicon (Si) or silicon carbide (SiC). Further, the semiconductor chip 132 may be a semiconductor element using gallium nitride (GaN), gallium arsenide (GaAs), or the like. As the semiconductor chip 132, a semiconductor element as an active component (for example, a silicon chip, such as a central processing unit (CPU)), an Insulated Gate Bipolar Transistor (IGBT), a Metal-Oxide-Semiconductor Field-Effect Transistor (MOSFET), a diode, or the like may be used. The semiconductor chip 132 is one example of an electronic component.

The conductive member 133 is, for example, a metal plate, such as a copper (Cu) plate.

The IC chip 140 is an integrated circuit on which electronic circuits with various functions are integrated on a semiconductor, and is an integrated circuit that outputs an electrical signal for driving the semiconductor chip 132. As the IC chip 140, for example, a gate controller or the like may be used. The IC chip 140 is one examples of a driving component.

The first metal layer 110 is a layer on which the semiconductor chip 132 and the conductive member 133 of the component mounting substrate 130 are mounted and on which the IC chip 140 is mounted. As a material of the first metal layer 110, for example, copper, a copper alloy, or the like may be used. Further, a thickness of the first metal layer 110 may be set to, for example, about 0.5 to 5.0 millimeters (mm). The first metal layer 110 may be referred to as a lead frame.

The first metal layer 110 includes a first mounting portion 111, a second mounting portion 112, a terminal portion 113, a terminal portion 114, and a lead portion 115.

The first mounting portion 111 and the second mounting portion 112 are planar portions that serve as a base material of the first metal layer 110. The semiconductor chip 132 and the conductive member 133 of the component mounting substrate 130 are mounted on an upper surface of the first mounting portion 111. Specifically, the semiconductor chip 132 and the conductive member 133 are bonded on the upper surface of the first mounting portion 111 via conductive bonding members 132*a* and 133*a*, respectively. As the conductive bonding members 132*a* and 133*a*, for example, solder paste, silver (Ag) paste, or the like may be used. Further, the IC chip 140 is mounted on an upper surface of the second mounting portion 112. Specifically, the IC chip 140 is mounted on the upper surface of the second mounting portion 112 via a conductive bonding member 141. As the conductive bonding member 141, for example, solder, thermal conductive paste, Thermal Interface Material (TIM), or the like may be used. A lower surface of the first mounting portion 111 is exposed from the sealing resin 150 and is able to dissipate heat that is generated by the semiconductor chip 132 that is mounted on the upper surface of the first mounting portion 111. A lower surface of the second mounting portion 112 is exposed from the sealing resin 150 and is able to dissipate heat that is generated by the IC chip 140 that is mounted on the upper surface of the second mounting portion 112.

The first mounting portion 111 is divided into a plurality of (two in this example) regions 111_1 and 111_2 that are independent of each other by a slit 111*a*. The semiconductor chip 132 of the component mounting substrate 130 is mounted on the region 111_1 that is one of the two regions 111_1 and 111_2, and the conductive member 133 of the component mounting substrate 130 is mounted on the region 111_2 that is the other one of the two regions. Therefore, the two regions 111_1 and 111_2 are electrically connected to each other via the component mounting substrate 130.

The terminal portion 113 is a protrusion that connects the first mounting portion 111 of the first metal layer 110 and the second metal layer 120. The terminal portion 113 protrudes from the upper surface of the first mounting portion 111 toward the second metal layer 120 along a side edge of the first mounting portion 111 at the side of the second mounting portion 112. Further, an upper end of the terminal portion 113 comes into contact with a wire portion 121 (to be described later) of the second metal layer 120 and supports the second metal layer 120 from below.

The terminal portion 114 is a protrusion that connects the second mounting portion 112 of the first metal layer 110 and the second metal layer 120. The terminal portion 114 protrudes from the upper surface of the second mounting portion 112 toward the second metal layer 120 along a side edge of the second mounting portion 112. Further, an upper end of the terminal portion 114 comes into contact with a wire portion 122 (to be described later) of the second metal layer 120 and supports the second metal layer 120 from below.

The lead portion 115 is electrically connected to the semiconductor chip 132 that is mounted on the first mounting portion 111 of the first metal layer 110, via the first mounting portion 111. Further, a distal end portion of the lead portion 115 protrudes from the sealing resin 150 and functions as an external terminal that connects the semiconductor chip 132 and the outside of the electronic apparatus 100.

The second metal layer 120 is a layer that holds the IC chip 140 in a sandwiching manner with the second mounting portion 112 of the first metal layer 110, and forms a wire portion that is connected to the passive component that is mounted on an upper surface of the electronic apparatus 100. As a material of the second metal layer 120, for example, copper, a copper alloy, or the like may be used. Further, a thickness of the second metal layer 120 may be set to, for example, about 0.1 to 0.5 mm. The second metal layer 120 may be referred to as a lead frame.

The second metal layer 120 includes a plurality of wire portions including the wire portions 121 and 122. The plurality of wire portions may be connected to one another at predetermined positions in a depth direction, which is not illustrated in FIG. 1A. Further, an arbitrary wire portion other than the wire portions 121 and 122 among the plurality of wire portions forms a wire portion that is connectable to the passive component that is mounted on the upper surface of the electronic apparatus 100. The second metal layer 120 is bonded to the IC chip 140 via solder 142 on a lower surface of the wire portion that is connectable to the passive component.

The wire portion 121 is a wire that connects the second metal layer 120 and the first mounting portion 111 of the first metal layer 110, and is supported by the terminal portion 113 of the first metal layer 110 from below. The wire portion 121 is arranged in the upper part of the first mounting portion 111 along the side edge of the first mounting portion 111 at the side of the second mounting portion 112. Further, a lower surface of the wire portion 121 comes into contact with the terminal portion 113 of the first metal layer 110 and electrically connects the second metal layer 120 and the first mounting portion 111 of the first metal layer 110.

The wire portion 121 and the terminal portion 113 connect the second metal layer 120 and the first mounting portion 111 of the first metal layer 110, so that it is possible to reduce a wire length between the second metal layer 120 and the first metal layer 110 as compared to a case in which the two metal layers are connected to each other by a wiring member. Therefore, it is possible to reduce inductance and prevent an influence of noise between the IC chip 140 that is bonded to the second metal layer 120 and the semiconductor chip 132 on the first mounting portion 111 of the first metal layer 110, so that it is possible to realize high-speed driving of the semiconductor chip 132.

Figure 2:
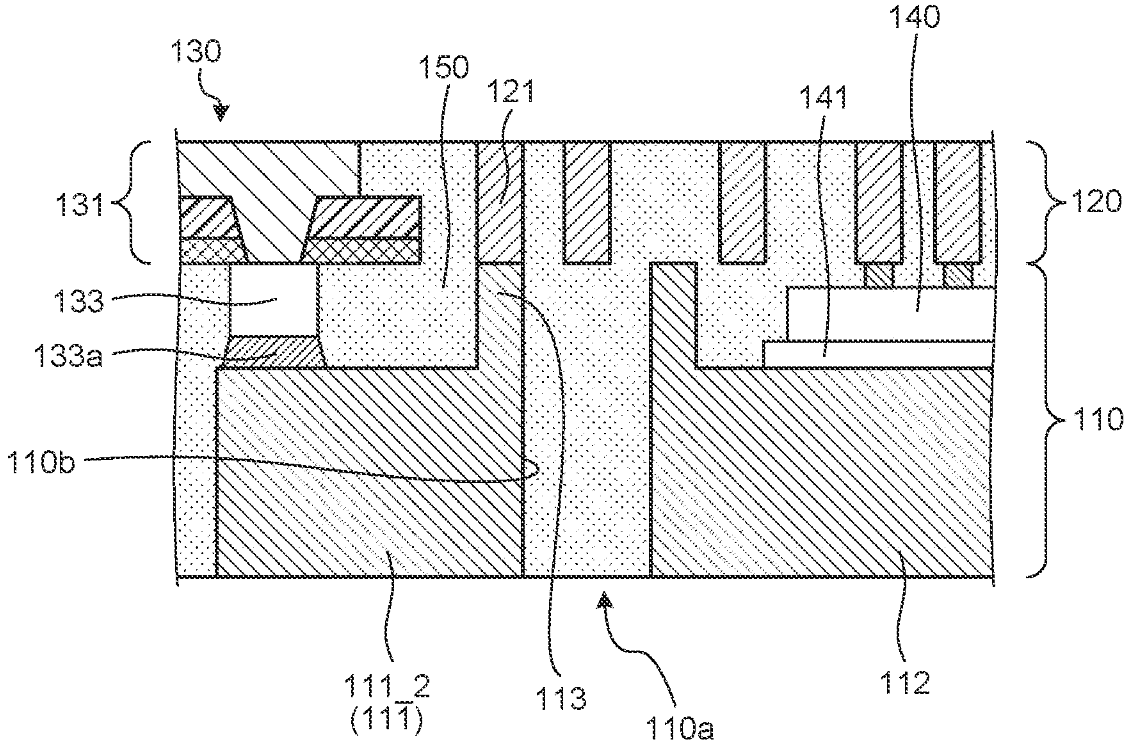
FIG. 2 is an enlarged cross-sectional view of a connection portion between a second metal layer and a first metal layer.

FIG. 2 is an enlarged cross-sectional view of a connection portion between the second metal layer 120 and the first metal layer 110.

The first mounting portion 111 and the second mounting portion 112 of the first metal layer 110 are separated from each other via a slit 110*a*. The first mounting portion 111 and the second mounting portion 112 are separated from each other via the slit 110*a*, so that it is possible to prevent a defect that is caused by a difference in driving voltage between the semiconductor chip 132 on the first mounting portion 111 and the IC chip 140 on the second mounting portion 112.

The terminal portion 113 of the first metal layer 110 is arranged along a side edge 110*b* that is adjacent to the slit 110*a* of the first mounting portion 111. In other words, the terminal portion 113 protrudes from the upper surface of the first mounting portion 111 at a position along the side edge 110*b* that is adjacent to the slit 110*a* of the first mounting portion 111. Further, the upper end of the terminal portion 113 comes into contact with the wire portion 121 of the second metal layer 120 that is arranged at a position along the side edge 110*b* that is adjacent to the slit 110*a* of the first mounting portion 111, and electrically connects the first metal layer 110 and the second metal layer 120. The terminal portion 113 is arranged so as to be adjacent to the slit 110*a* that separates the first mounting portion 111 and the second mounting portion 112 from each other and connect the first metal layer 110 and the second metal layer 120, so that it is possible to further reduce a wire length between the second metal layer 120 and the first metal layer 110. With this configuration, it is possible to further reduce inductance and further prevent an influence of noise between the IC chip 140 that is bonded to the second metal layer 120 and the semiconductor chip 132 on the first metal layer 110, so that it is possible to realize high-speed driving of the semiconductor chip 132.

Further, the terminal portion 113 of the first metal layer 110 is covered by the sealing resin 150. With this configuration, it is possible to reduce inductance and prevent an influence of noise in the terminal portion 113, so that it is possible to realize high-speed driving of the semiconductor chip 132.

Referring back to explanation of FIG. 1A and FIG. 1B, the wire portion 122 is a wire that connects the second metal layer 120 and the second mounting portion 112 of the first metal layer 110, and is supported by the terminal portion 114 of the first metal layer 110 from below. The wire portion 122 is arranged in the upper part of the second mounting portion 112 along the side edge of the second mounting portion 112. Further, a lower surface of the wire portion 122 comes into contact with the terminal portion 114 of the first metal layer 110 and electrically connects the second metal layer 120 and the second mounting portion 112 of the first metal layer 110.

The wire portion 122 and the terminal portion 114 connect the second metal layer 120 and the second mounting portion 112 of the first metal layer 110, so that it is possible to increase bonding strength between the second metal layer 120 and the first metal layer 110 and it is possible to prevent detachment of the first metal layer 110 from the sealing resin 150.

The component mounting substrate 130 includes a wiring board 131, the semiconductor chip 132, and the conductive member 133.

The semiconductor chip 132 and the conductive member 133 are mounted on a lower surface of the wiring board 131. The wiring board 131 includes an insulating base material 311, an adhesive layer 312, and a wiring layer 313.

The insulating base material 311 is an insulating film-like member and is a base material of the wiring board 131. As a material of the insulating base material 311, for example, insulating resin, such as polyimide resin, polyethylene resin, or epoxy resin, may be used.

The adhesive layer 312 bonds the semiconductor chip 132 and the conductive member 133 on a lower surface of the insulating base material 311. As a material of the adhesive layer 312, for example, an adhesive agent of an epoxy type, a polyimide type, a silicone type, or the like may be used.

The wiring layer 313 is formed on an upper surface of the insulating base material 311. The wiring layer 313 is electrically connected to the semiconductor chip 132 and the conductive member 133 via vias that penetrate through the insulating base material 311 and the adhesive layer 312. The wiring layer 313 is connected to the semiconductor chip 132 and the conductive member 133 via the vias, so that the semiconductor chip 132 and the conductive member 133 are mounted on the lower surface of the wiring board 131. An upper surface of the wiring layer 313 is exposed from the sealing resin 150 at the upper surface of the electronic apparatus 100.

Each of the semiconductor chip 132 and the conductive member 133 mounted on the lower surface of the wiring board 131 is mounted on the first mounting portion 111 of the first metal layer 110. Specifically, the semiconductor chip 132 and the conductive member 133 are bonded to the upper surface of the first mounting portion 111 via the conductive bonding members 132*a* and 133*a*, respectively.

The first metal layer 110, the second metal layer 120, the component mounting substrate 130, and the IC chip 140 are subjected to resin sealing with the sealing resin 150. Specifically, spaces around the first metal layer 110, the second metal layer 120, the component mounting substrate 130, and the IC chip 140 are filled with the sealing resin 150. As the sealing resin 150, for example, insulating resin, such as thermosetting epoxy resin, may be used.

Figure 3:
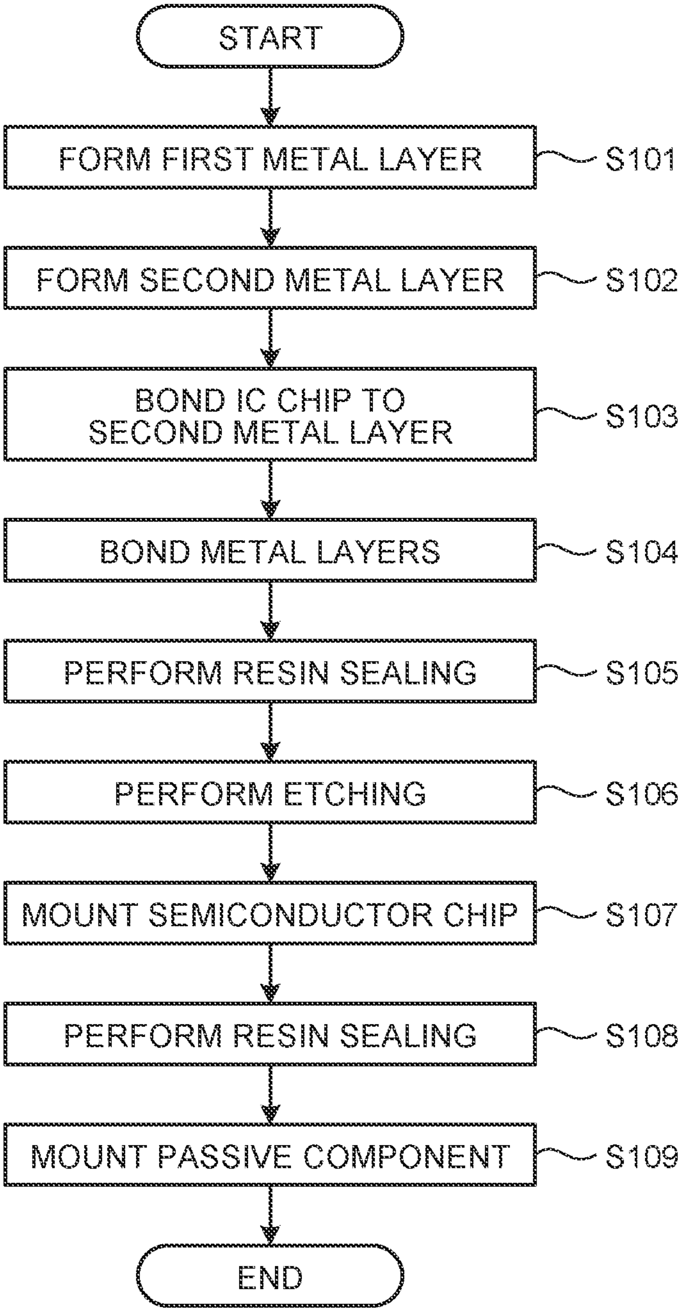
FIG. 3 is a flowchart illustrating an example of the flow of a method of manufacturing the electronic apparatus according to one embodiment.

A method of manufacturing the electronic apparatus 100 configured as described above will be described below with reference to FIG. 3. FIG. 3 is a flowchart illustrating an example of the method of manufacturing the electronic apparatus 100 according to one embodiment.

First, the first metal layer 110 and the second metal layer 120 that serve as a skeletal structure of the electronic apparatus 100 are formed (Steps S101 and S102). Each of the first metal layer 110 and the second metal layer 120 is formed by performing etching or pressing on a metal plate.

Figure 4:
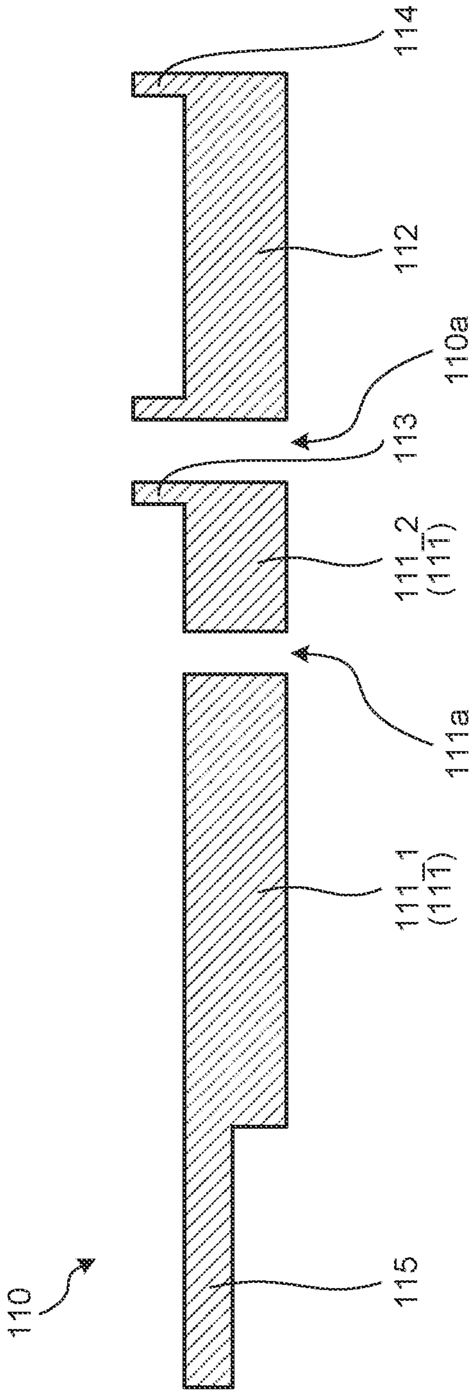
FIG. 4 is a diagram illustrating a specific example of a first metal layer formation process.

Specifically, as illustrated in FIG. 4 for example, the first metal layer 110 that includes the first mounting portion 111, the second mounting portion 112, the terminal portion 113, the terminal portion 114, and the lead portion 115 is formed from the metal plate. FIG. 4 is a diagram illustrating a specific example of a first metal layer formation process.

Figure 5:
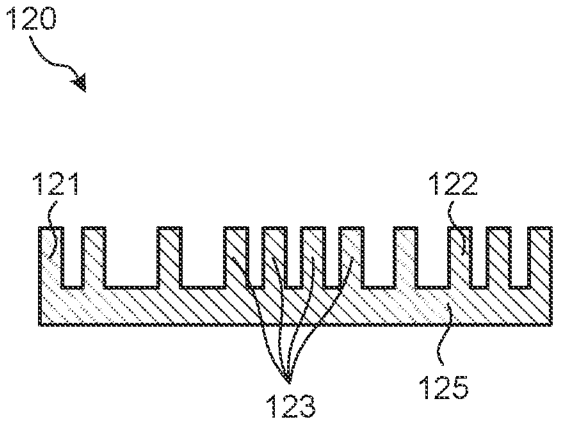
FIG. 5 is a diagram illustrating a specific example of a second metal layer formation process.

Further, as illustrated in FIG. 5 for example, the second metal layer 120 that includes the plurality of wire portions including the wire portions 121 and 122 and a connection portion 125 that connects the plurality of wire portions is formed from the metal plate. FIG. 5 is a diagram illustrating a specific example of a second metal layer formation process. Arbitrary wire portions other than the wire portions 121 and 122 among the plurality of wire portions forms wire portions 123 that are connectable to a passive component that is mounted on the upper surface of the electronic apparatus 100. The wire portions 123 are formed at positions corresponding to an upper surface of the IC chip 140.

Figure 6:
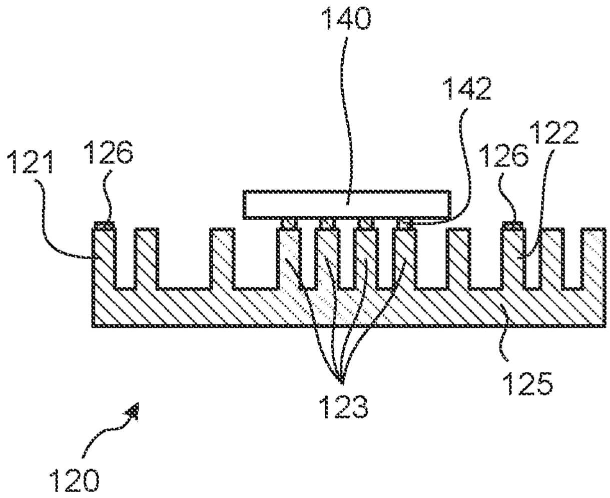
FIG. 6 is a diagram illustrating a specific example of an IC chip bonding process.

After the first metal layer 110 and the second metal layer 120 are formed by performing etching or pressing on the metal plate, the IC chip 140 is bonded to the second metal layer 120 (Step S103). Specifically, as illustrated in FIG. 6 for example, the IC chip 140 is bonded to the second metal layer 120 via the solder 142 on the lower surface (upper surface in FIG. 6) of the wire portion 123. FIG. 6 is a diagram illustrating a specific example of the IC chip bonding process. Further, solder for bonding the first metal layer 110 and the second metal layer 120 is applied to the second metal layer 120 at the same time as bonding of the IC chip 140. For example, as illustrated in FIG. 6, solder 126 is applied to the wire portions 121 and 122. The solder 126 may be applied by printing solder paste or by using a dispenser. Further, it may be possible to use conductive paste instead of the solder paste. Meanwhile, in the drawings other than FIG. 6, illustration of the solder 126 is omitted.

Figure 7:
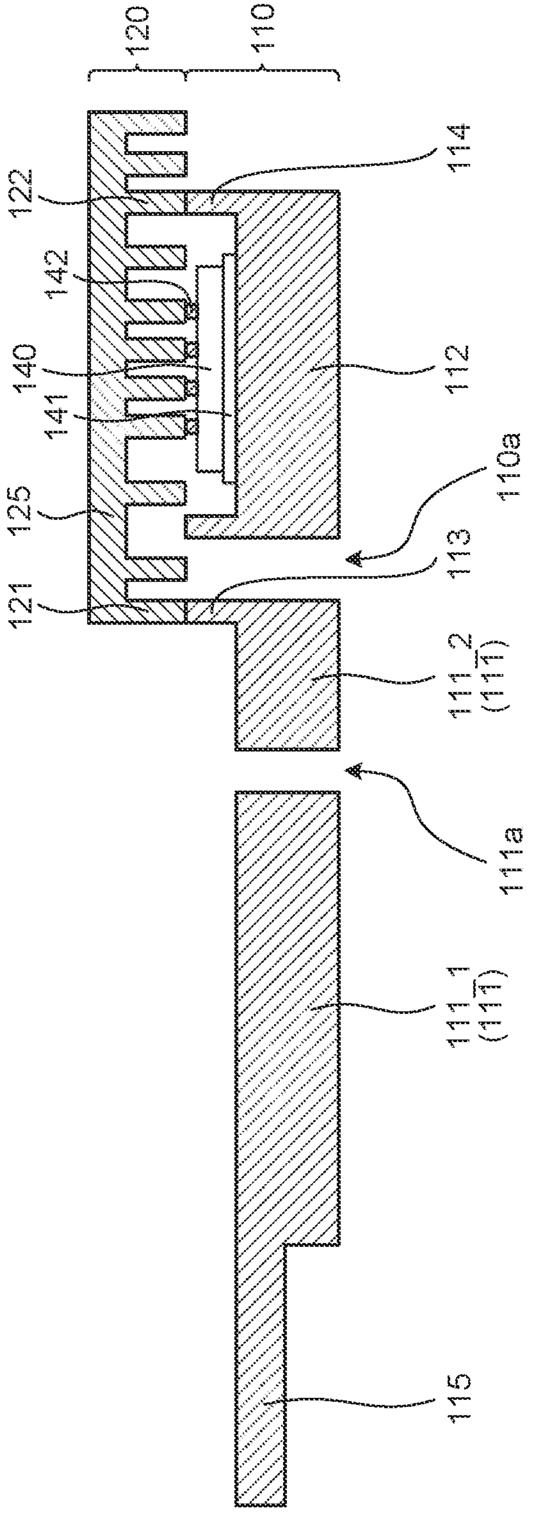
FIG. 7 is a diagram illustrating a specific example of a metal layer bonding process.

After the IC chip 140 is bonded and the solder 126 is applied onto the second metal layer 120, the second metal layer 120 is laminated on the first metal layer 110 and the first metal layer 110 and the second metal layer 120 are bonded (Step S104). Specifically, the IC chip 140 is bonded to the upper surface of the second mounting portion 112 via the conductive bonding member 141 and, for example, a reflow process is performed, so that the wire portions 121 and 122 are bonded to the terminal portions 113 and 114, respectively, via the solder 126. Consequently, as illustrated in FIG. 7 for example, an intermediate structure in which the second metal layer 120 and the second mounting portion 112 of the first metal layer 110 sandwich the IC chip 140 is formed. FIG. 7 is a diagram illustrating a specific example of a metal layer bonding process.

Figure 8:
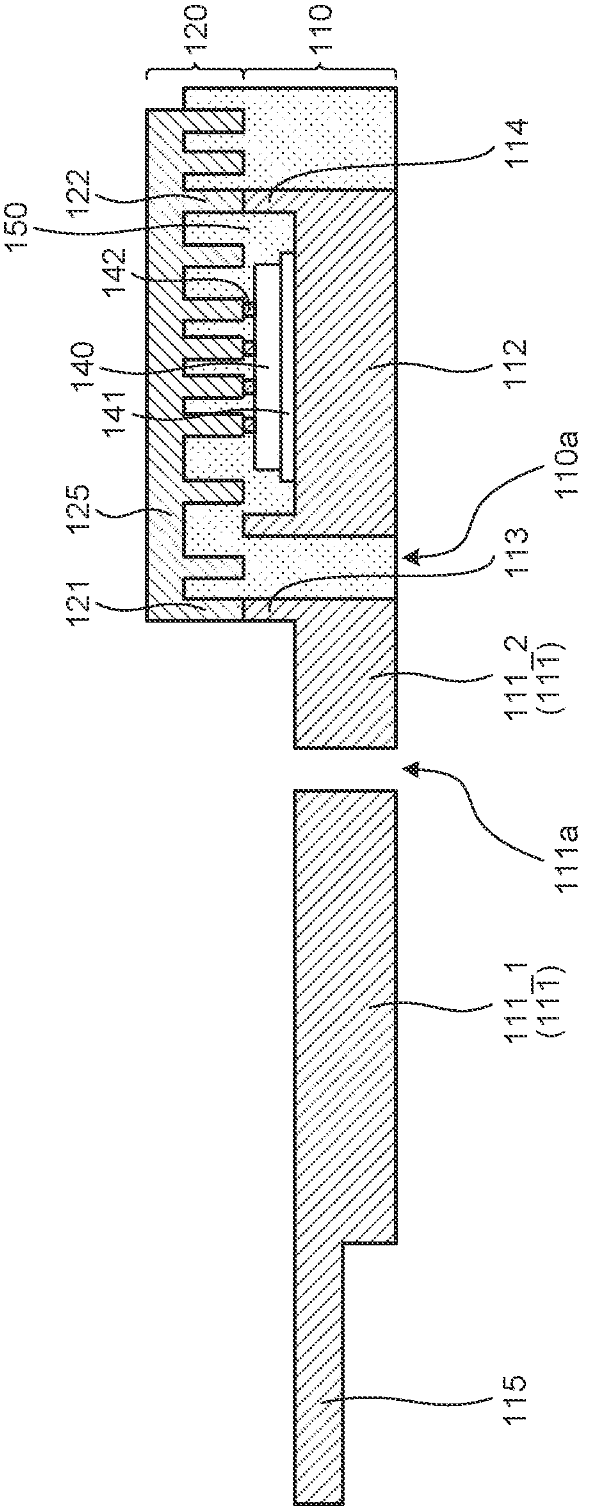
FIG. 8 is a diagram illustrating a specific example of a resin sealing process.

The second mounting portion 112 of the first metal layer 110, the second metal layer 120, and the IC chip 140 in the intermediate structure are subjected to resin sealing by, for example, transfer molding (Step S105). Specifically, the second mounting portion 112 of the first metal layer 110, the second metal layer 120, and the IC chip 140 in the intermediate structure are set in a cavity of a mold, the uncured sealing resin 150 is injected from a plunger to the cavity, and thereafter the sealing resin 150 is heated and cured. As a resin sealing method, it may be possible to use, for example, a compression molding method, an injection molding method, or the like, instead of the transfer molding method. The second mounting portion 112 of the first metal layer 110, the second metal layer 120, and the IC chip 140 in the intermediate structure are subjected to resin sealing, so that, as illustrated in FIG. 8 for example, the spaces around the second mounting portion 112, the second metal layer 120, and the IC chip 140 are filled with the sealing resin 150. FIG. 8 is a diagram illustrating a specific example of a resin sealing process.

Figure 9:
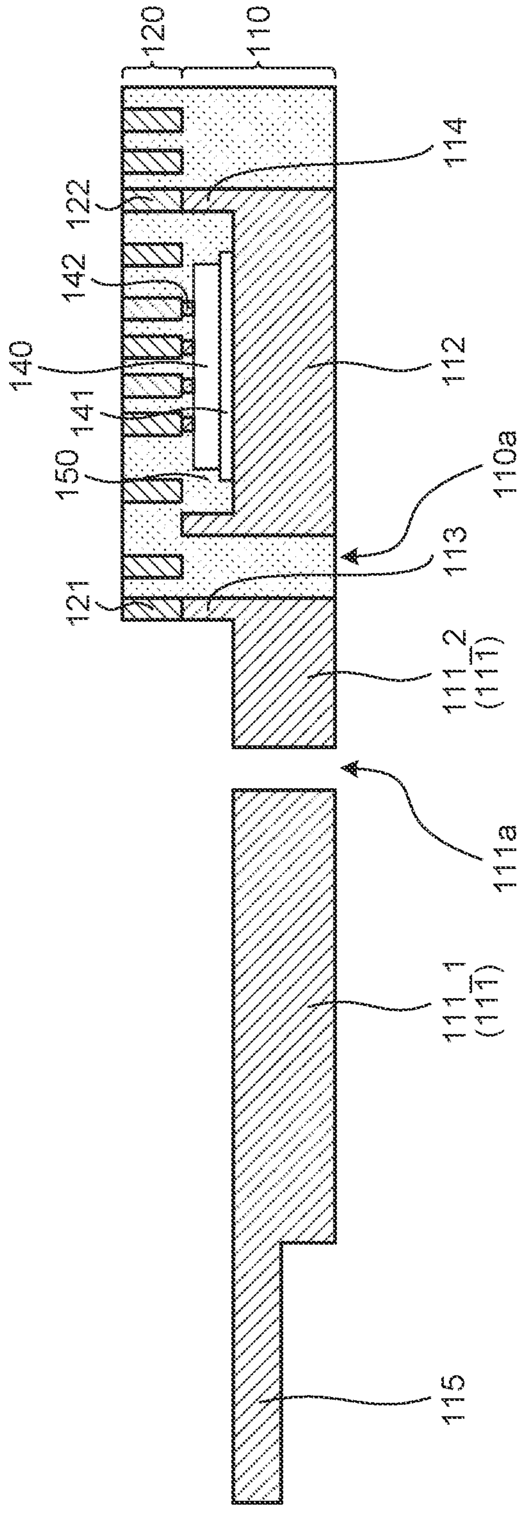
FIG. 9 is a diagram illustrating a specific example of an etching process.

After the second mounting portion 112 of the first metal layer 110, the second metal layer 120, and the IC chip 140 in the intermediate structure are subjected to resin sealing, the second metal layer 120 is subjected to etching (Step S106), and a portion other than the plurality of wire portions is removed from the second metal layer 120. Specifically, as illustrated in FIG. 9 for example, the second metal layer 120 is melted by etching such that the plurality of wire portions including the wire portions 121 to 123 remain and the connection portion 125 is removed. FIG. 9 is a diagram illustrating a specific example of an etching process.

Figure 10:
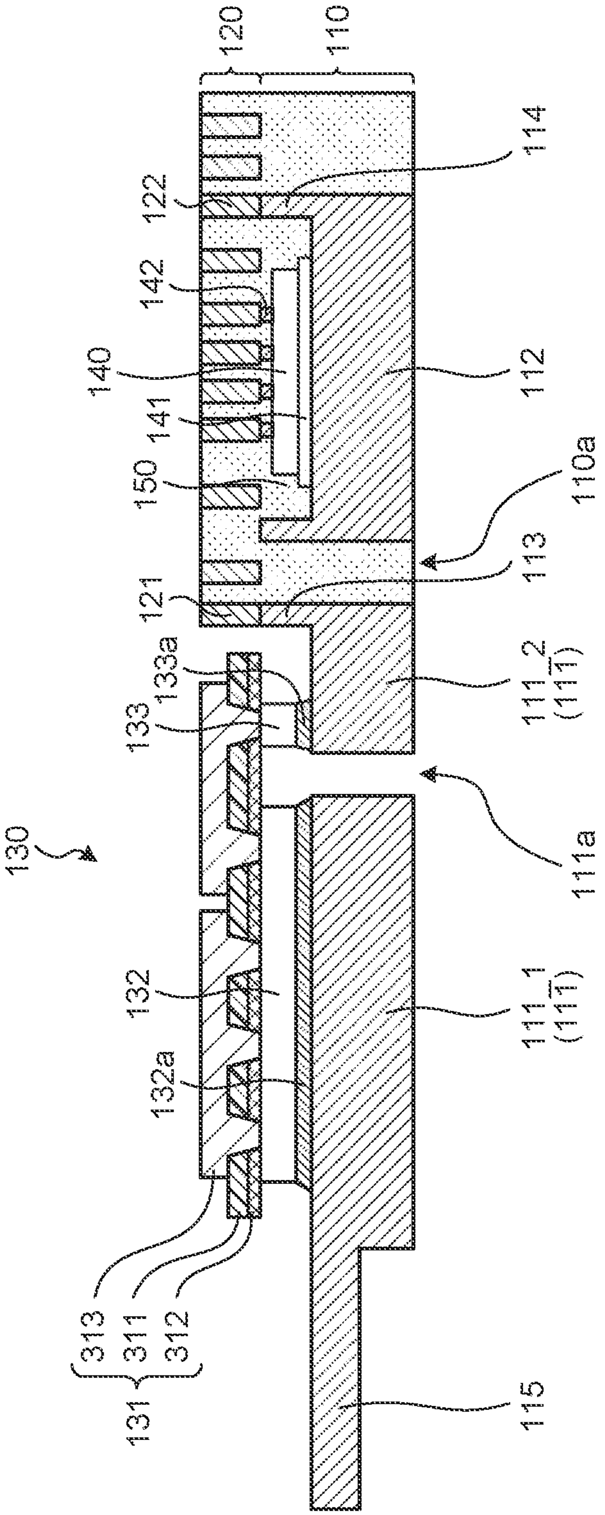
FIG. 10 is a diagram illustrating a specific example of a semiconductor chip mounting process.

After etching of the second metal layer 120 is completed, the semiconductor chip 132 and the conductive member 133 of the component mounting substrate 130 are mounted on the first mounting portion 111 of the first metal layer 110 (Step S107). Specifically, the semiconductor chip 132 and the conductive member 133 are bonded to the upper surface of the first mounting portion 111 via the conductive bonding members 132*a* and 133*a*, respectively. Consequently, as illustrated in FIG. 10 for example, the intermediate structure that includes the first metal layer 110 on which the semiconductor chip 132 and the conductive member 133 of the component mounting substrate 130 are mounted and the second metal layer 120 is formed. FIG. 10 is a diagram illustrating a specific example of a semiconductor chip mounting process.

Figure 11:
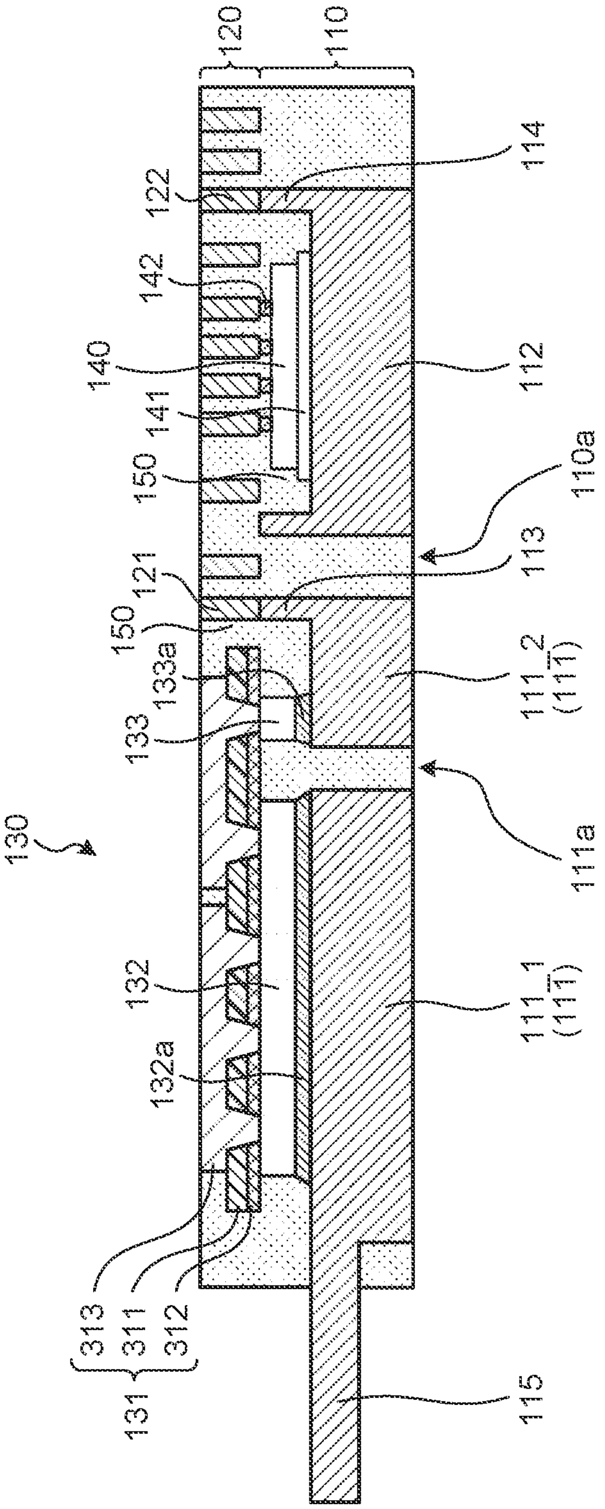
FIG. 11 is a diagram illustrating a specific example of a resin sealing process.

The first mounting portion 111 of the first metal layer 110 and the component mounting substrate 130 in the intermediate structure is subjected to resin sealing by, for example, transfer molding (Step S108), and the electronic apparatus 100 is completed. Specifically, the first mounting portion 111 of the first metal layer 110 and the component mounting substrate 130 in the intermediate structure are set in a cavity of a mold, the uncured sealing resin 150 is injected from a plunger to the cavity, and thereafter the sealing resin 150 is heated and cured. As a resin sealing method, it may be possible to use, for example, a compression molding method, an injection molding method, or the like, instead of the transfer molding method. The first mounting portion 111 of the first metal layer 110 and the component mounting substrate 130 in the intermediate structure are subjected to resin sealing, so that, as illustrated in FIG. 11 for example, the spaces around the first mounting portion 111 and the component mounting substrate 130 are filled with the sealing resin 150. FIG. 11 is a diagram illustrating a specific example of the resin sealing process.

In the electronic apparatus 100 that is obtained through the processes as described above, the semiconductor chip 132 is mounted on the upper surface of the first mounting portion 111 of the first metal layer 110 and the IC chip 140 is mounted in a region that is sandwiched between the second mounting portion 112 of the first metal layer 110 and the second metal layer 120. Further, the electronic apparatus 100 electrically connects the second metal layer 120 and the first mounting portion 111 of the first metal layer 110 by the wire portion 121 and the terminal portion 113 that come into contact with each other. Therefore, it is possible to connect the second metal layer 120 and the first metal layer 110 with a relatively short wire length, so that it is possible to reduce inductance and prevent an influence of noise in a wire path that connects the IC chip 140 and the semiconductor chip 132. As a result, it is possible to realize high-speed driving of the semiconductor chip 132.

Figure 12:
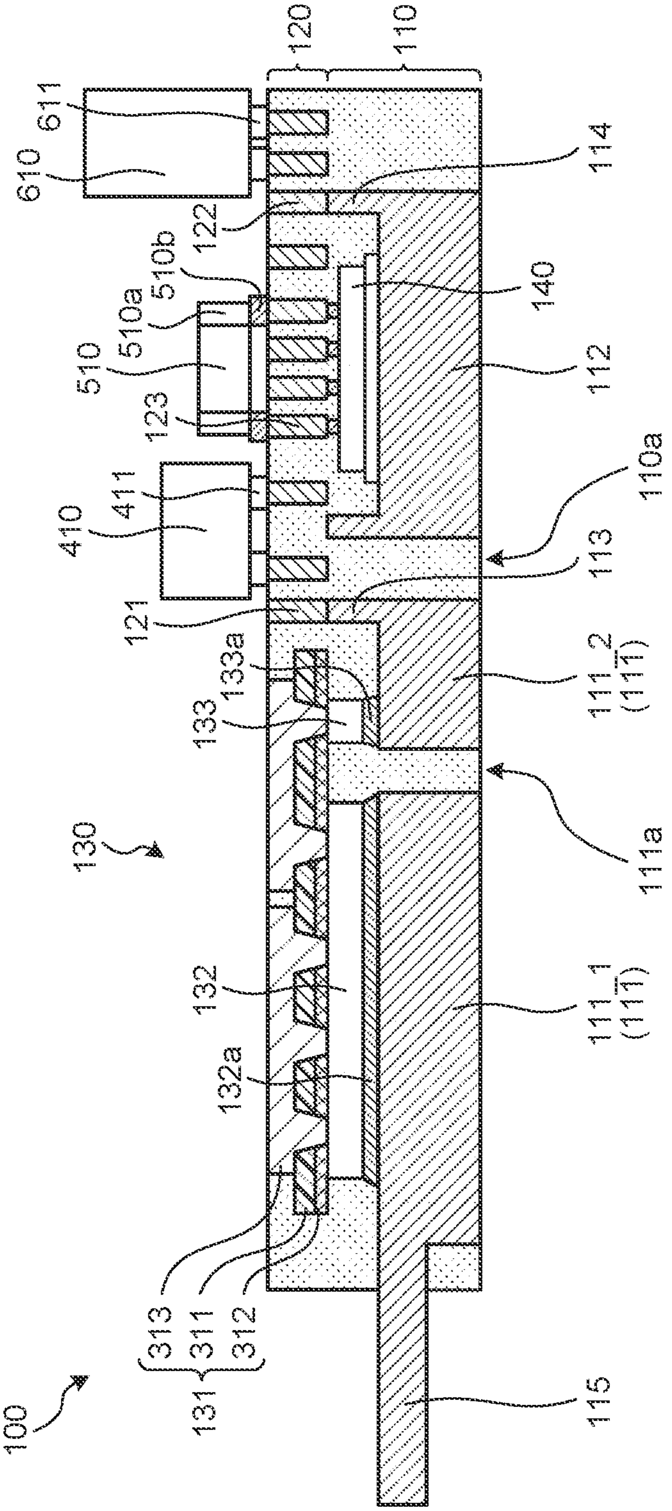
FIG. 12 is a diagram illustrating an example of mounting of a passive component on the electronic apparatus.

A passive component is mounted on the electronic apparatus 100 (Step S109). Specifically, as illustrated in FIG. 12 for example, each of passive components 410, 510, and 610 is mounted on upper surfaces of predetermined wire portions, such as the wire portions 123, on the second metal layer 120. FIG. 12 is a diagram illustrating an example of mounting of the passive components 410, 510, and 610 on the electronic apparatus 100. The passive component 410 is connected by flip chip interconnection to the upper surfaces of the predetermined wire portions, such as the wire portions 123, by, for example, solder bumps 411. Further, terminals 510*a* of the passive component 510 are connected to the upper surfaces of the predetermined wire portions, such as the wire portions 123, by solder 510*b*. Furthermore, the passive component 610 is connected by flip chip interconnection to the upper surfaces of the predetermined wire portions, such as the wire portions 123, by, for example, solder bumps 611. As the passive components 410, 510, and 610, for example, a passive component, such as a capacitor, an inductor, or a resistance element, may be used.

Modification

Figure 13:
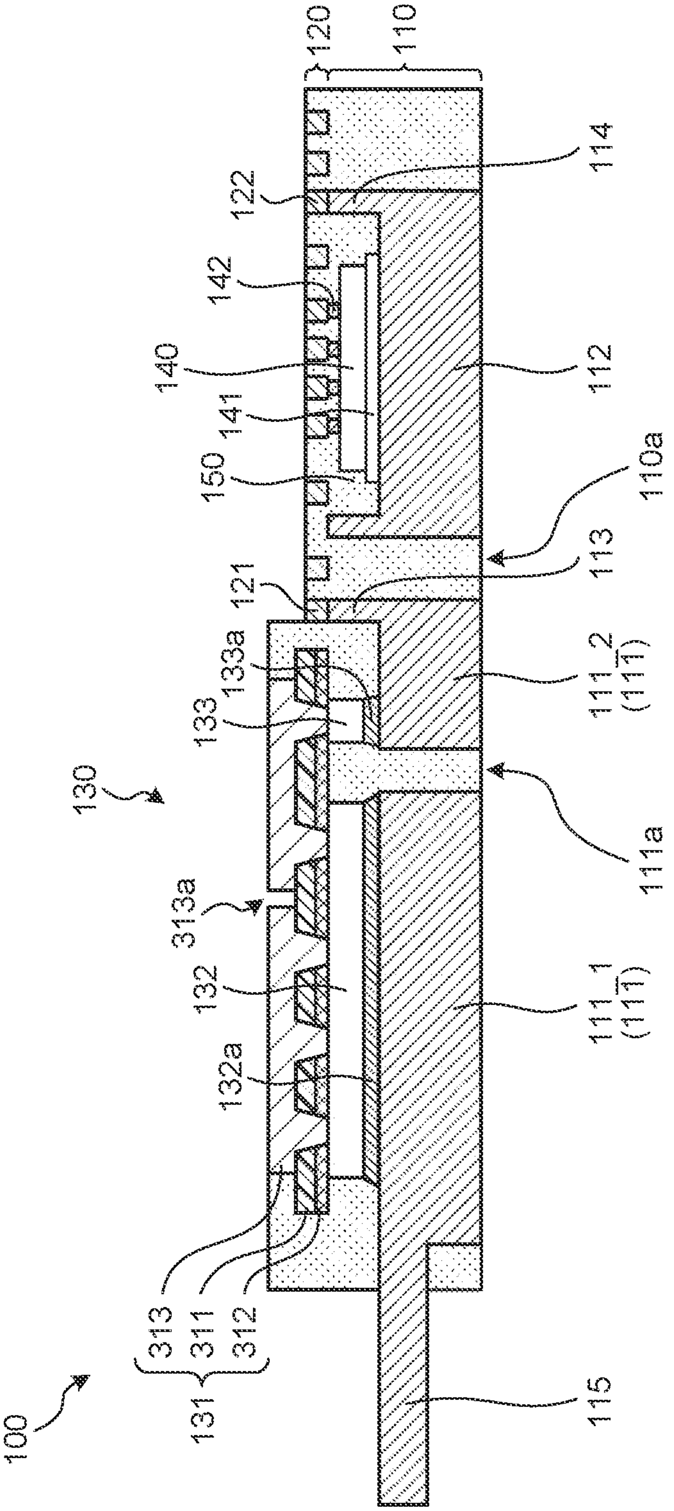
FIG. 13 is a schematic cross-sectional view illustrating a configuration of an electronic apparatus according to a modification of the embodiment.

FIG. 13 is a schematic cross-sectional view illustrating a configuration of the electronic apparatus 100 according to a modification of the embodiment. Meanwhile, in the modification, the same components as those of the embodiment will be denoted by the same reference symbols, and repeated explanation will be omitted.

As illustrated in FIG. 13, in the modification, the wiring layer 313 of the wiring board 131 has wiring patterns that are arranged with a gap 313*a* that is not filled with the sealing resin 150. The gap 313*a* between the wiring patterns of the wiring layer 313 is not filled with the sealing resin 150, so that it is possible to reduce a use amount of the sealing resin 150. Furthermore, in the modification, the upper surface of the second metal layer 120 (that is, upper surfaces of the plurality of wire portions including the wire portions 121 and 122) are formed at a position below the upper surface of the component mounting substrate 130. With this configuration, it is possible to reduce thicknesses of the wire portions that are connectable to the passive component that is mounted on the upper surface of the electronic apparatus 100, so that it is possible to accelerate reduction of a thickness of the electronic apparatus 100.

Figure 14:
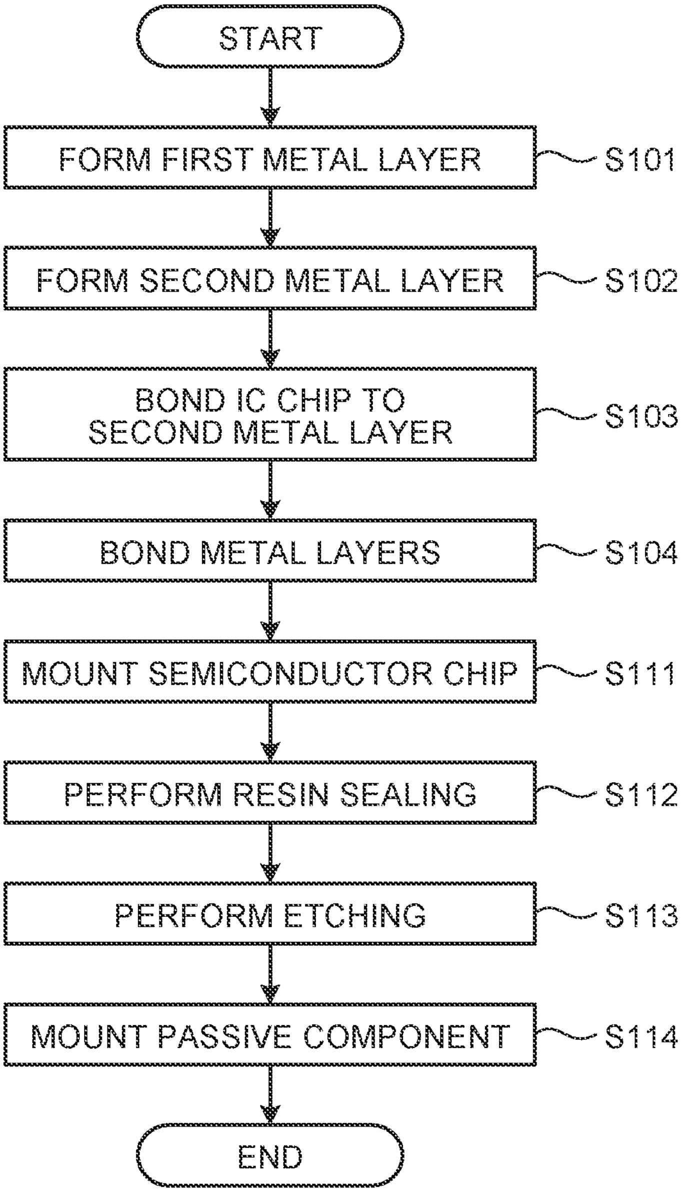
FIG. 14 is a flowchart illustrating an example of the flow of a method of manufacturing the electronic apparatus according to the modification of the embodiment.

A method of manufacturing the electronic apparatus 100 according to the modification of the embodiment will be described below with reference to FIG. 14. FIG. 14 is a flowchart illustrating an example of the flow of the method of manufacturing the electronic apparatus 100 according to the modification of the embodiment. In FIG. 14, the same processes as those in FIG. 3 will be denoted by the same reference symbols.

Figure 15:
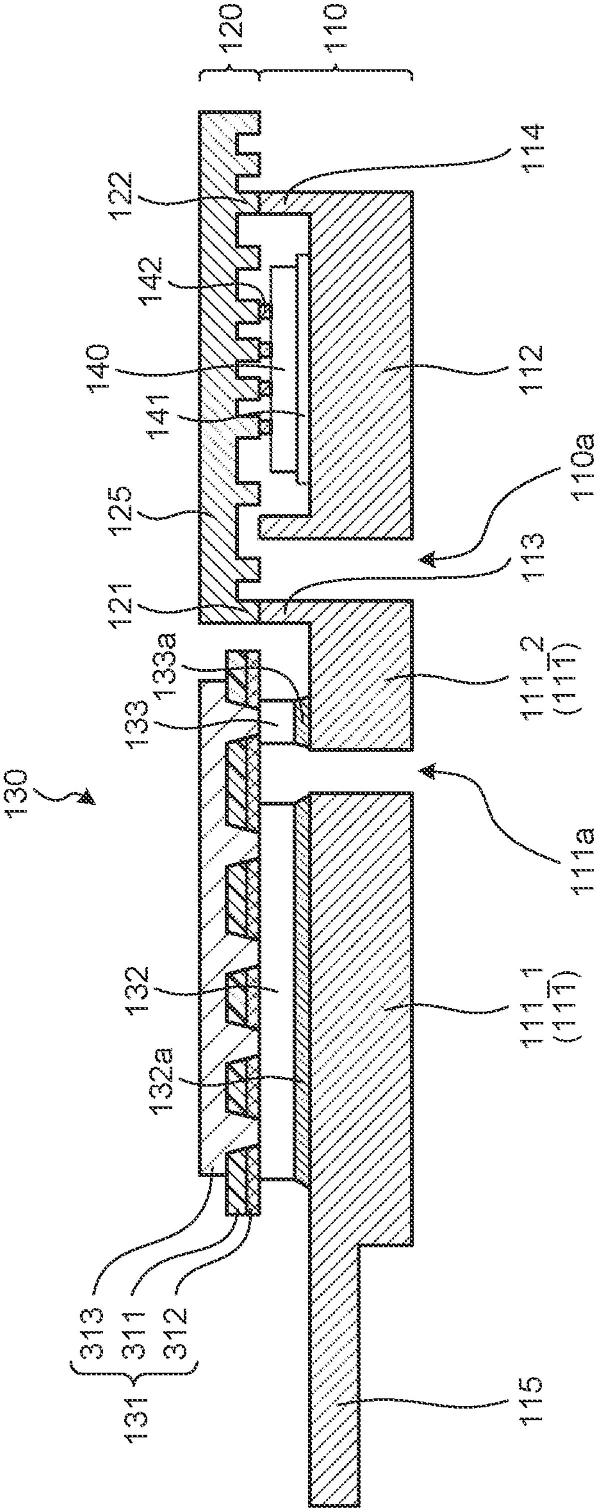
FIG. 15 is a diagram illustrating a specific example of a semiconductor chip mounting process.

After the first metal layer 110 and the second metal layer 120 are bonded (Step S104), the semiconductor chip 132 and the conductive member 133 of the component mounting substrate 130 are mounted on the first mounting portion 111 of the first metal layer 110 (Step S111). Specifically, the semiconductor chip 132 and the conductive member 133 are bonded to the upper surface of the first mounting portion 111 via the conductive bonding members 132*a* and 133*a*, respectively. Consequently, as illustrated in FIG. 15 for example, the intermediate structure that includes the first metal layer 110 on which the semiconductor chip 132 and the conductive member 133 of the component mounting substrate 130 are mounted and the second metal layer 120 is formed. FIG. 15 is a diagram illustrating a specific example of a semiconductor chip mounting process. At the time the intermediate structure as illustrated in FIG. 15 is formed, the wiring patterns are not formed in the wiring layer 313 of the wiring board 131.

Figure 16:
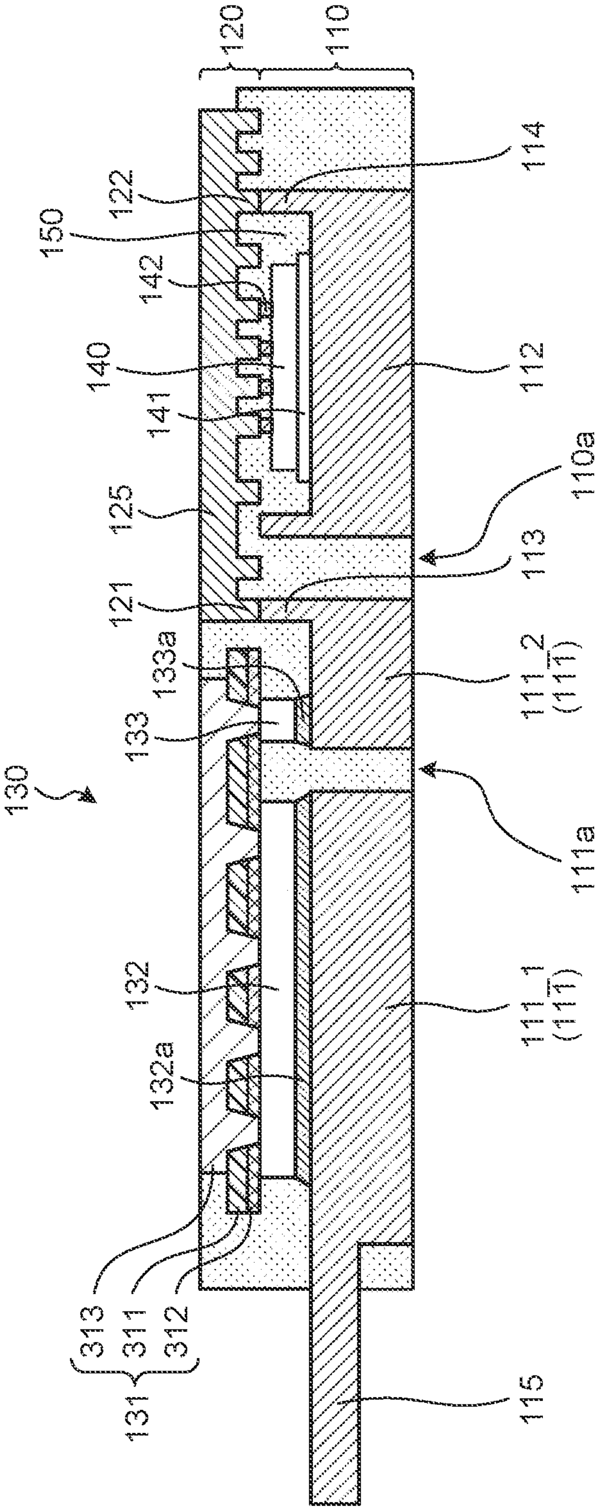
FIG. 16 is a diagram illustrating a specific example of a resin sealing process.

The entire intermediate structure is subjected to resin sealing by, for example, transfer molding (Step S112). Specifically, the intermediate structure is set in a cavity of a mold, the uncured sealing resin 150 is injected from a plunger to the cavity, and thereafter the sealing resin 150 is heated and cured. As a resin sealing method, it may be possible to use, for example, a compression molding method, an injection molding method, or the like, instead of the transfer molding method. The entire intermediate structure is subjected to resin sealing, so that, as illustrated in FIG. 16 for example, the spaces around the first metal layer 110, the second metal layer 120, the component mounting substrate 130, and the IC chip 140 are filled with the sealing resin 150. FIG. 16 is a diagram illustrating a specific example of a resin sealing process. Specifically, the space between the second mounting portion 112 of the first metal layer 110 and the second metal layer 120 is filled with the sealing resin 150, so that the IC chip 140 is sealed. Further, the upper surface of the first mounting portion 111 of the first metal layer 110 and the component mounting substrate 130 are covered by the sealing resin 150, so that the wiring board 131, the semiconductor chip 132, and the conductive member 133 of the component mounting substrate 130 are sealed. In this case, the wiring board 131 is sealed such that the upper surface of the wiring layer 313 is exposed from the sealing resin 150.

Figure 17:
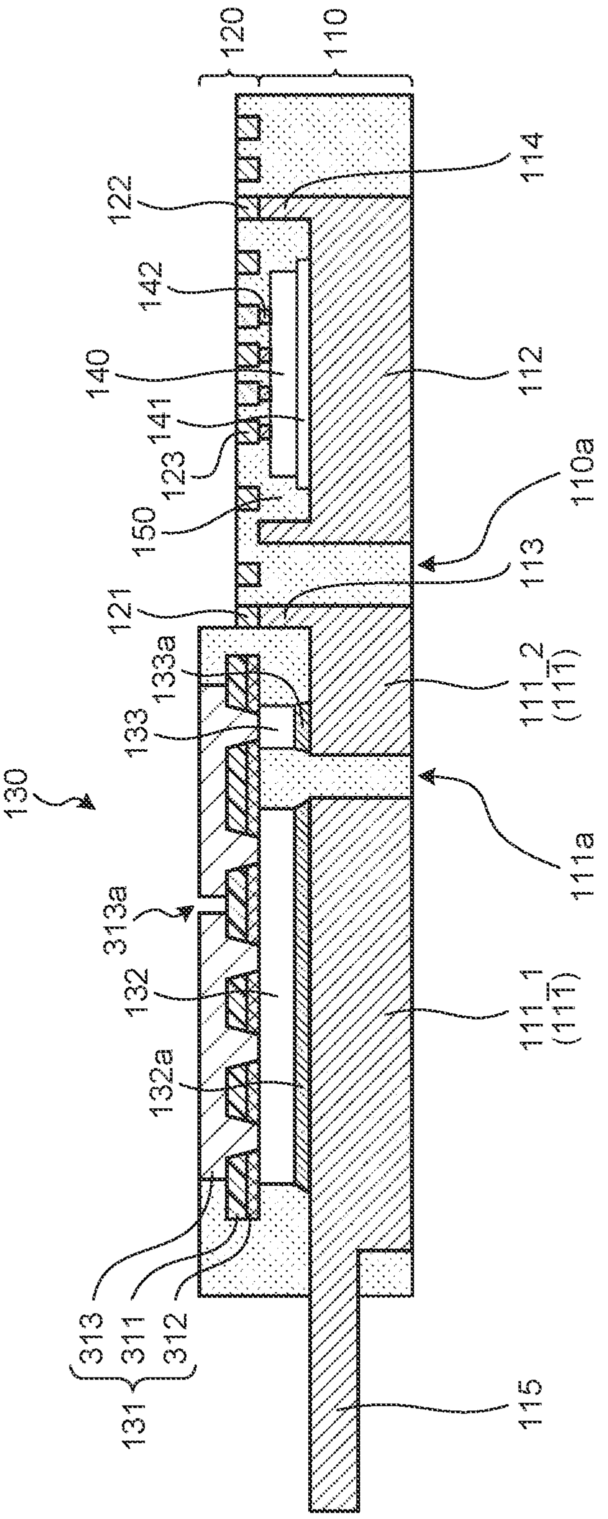
FIG. 17 is a diagram illustrating a specific example of an etching process.

After the entire intermediate structure is subjected to resin sealing, the second metal layer 120 and the wiring layer 313 of the wiring board 131 exposed from the sealing resin 150 are collectively subjected to etching (Step S113). By performing etching on the second metal layer 120 and the wiring layer 313, a portion other than the plurality of wire portions is removed from the second metal layer 120 and the wiring patterns are formed in the wiring layer 313. Specifically, as illustrated in FIG. 17 for example, the second metal layer 120 is melted by etching such that the plurality of wire portions including the wire portions 121 to 123 remain and the connection portion 125 is removed. Further, as illustrated in FIG. 17 for example, the wiring layer 313 is melted by etching such that the wiring patterns that are arranged at an interval, that is, the gap 313*a*, are formed. The gap 313*a* is formed at a position that is melted by the etching in the wiring layer 313, and therefore serves as a space that is not filled with the sealing resin 150. FIG. 17 is a diagram illustrating a specific example of an etching process. After etching of the second metal layer 120 and the wiring layer 313 is completed, the electronic apparatus 100 is completed. Meanwhile, if the wiring layer 313 is patterned in advance, a space between patterns is filled with the sealing resin 150.

Figure 18:
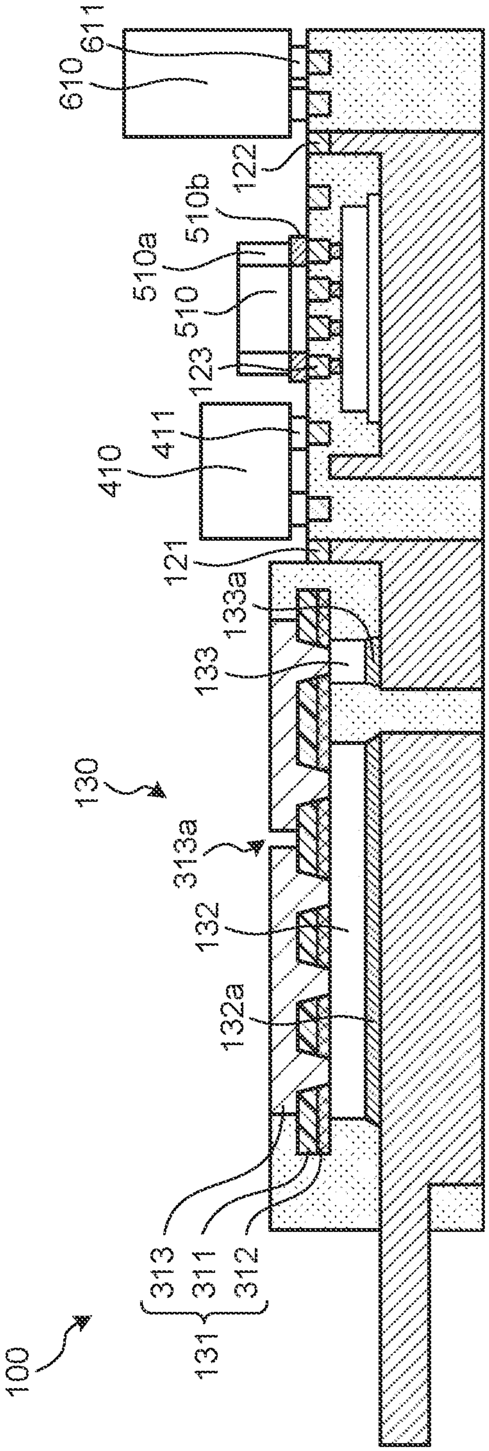
FIG. 18 is a diagram illustrating an example of mounting of a passive component on the electronic apparatus.

A passive component is mounted on the electronic apparatus 100 (Step S114). Specifically, as illustrated in FIG. 18 for example, each of the passive components 410, 510, and 610 is mounted on the upper surface of the predetermined wire portion, such as the wire portion 123, in the second metal layer 120. FIG. 18 is a diagram illustrating an example of mounting of the passive components 410, 510, and 610 on the electronic apparatus 100. The passive component 410 is connected by flip chip interconnection to the upper surfaces of the predetermined wire portions, such as the wire portions 123, by, for example, the solder bumps 411. Further, the terminals 510*a* of the passive component 510 are connected to the upper surfaces of the predetermined wire portions, such as the wire portions 123, by the solder 510*b*. Furthermore, the passive component 610 is connected by flip chip interconnection to the upper surfaces of the predetermined wire portions, such as the wire portions 123, by, for example, the solder bumps 611. As the passive components 410, 510, and 610, for example, a passive component, such as a capacitor, an inductor, or a resistance element, may be used.

As described above, an electronic apparatus (for example, the electronic apparatus 100) according to one embodiment includes a first metal layer (for example, the first metal layer 110), a component mounting substrate (for example, the component mounting substrate 130), a second metal layer (for example, the second metal layer 120), and sealing resin (for example, the sealing resin 150). The first metal layer includes a first mounting portion (for example, the first mounting portion 111) and a second mounting portion (for example, the second mounting portion 112). The component mounting substrate includes a wiring board (for example, the wiring board 131) and an electronic component (for example, the semiconductor chip 132) that is mounted on the wiring board, and the electronic component is mounted on the first mounting portion. The second metal layer is bonded to a driving component (for example, the IC chip 140) that drives the electronic component, and is arranged on the first metal layer such that the second metal layer and the second mounting portion sandwich the driving component. The sealing resin fills a space between the first metal layer and the second metal layer, covers the component mounting substrate, and seals the electronic component and the driving component. The first metal layer includes a terminal portion (for example, the terminal portion 113) that protrudes from the first mounting portion toward the second metal layer. The second metal layer includes a wire portion (for example, the wire portion 121) that comes into contact with the terminal portion and electrically connects the second metal layer and the first mounting portion. With this configuration, according to the electronic apparatus of one embodiment, it is possible to realize high-speed driving of the electronic component.

Furthermore, the first mounting portion and the second mounting portion may be separated from each other via a slit (for example, the slit 110*a*). With this configuration, according to the electronic apparatus of one embodiment, it is possible to prevent a defect that is caused by a difference in driving voltage between the electronic component on the first mounting portion and the driving component on the second mounting portion.

Moreover, the terminal portion may be arranged along a side edge (for example, the side edge 110*b*) that is adjacent to the slit of the first mounting portion. With this configuration, according to the electronic apparatus of one embodiment, it is possible to realize high-speed driving of the electronic component.

Furthermore, the terminal portion may be covered by the sealing resin. With this configuration, according to the electronic apparatus of one embodiment, it is possible to realize high-speed driving of the electronic component.

Moreover, the first metal layer may include a different terminal portion (for example, the terminal portion 114) that protrudes from the second mounting portion toward the second metal layer along a side edge of the second mounting portion. The second metal layer may include a different wire portion (for example, the wire portion 122) that comes into contact with the different terminal portion and electrically connects the second metal layer to the second mounting portion. With this configuration, according to the electronic apparatus of one embodiment, it is possible to prevent the first metal layer from coming off from the sealing resin.

Furthermore, the electronic component may be mounted on one surface (for example, an upper surface) of the first mounting portion, and a surface (for example, a lower surface) of the first mounting portion opposite to the surface on which the electronic component is mounted may be exposed from the sealing resin. With this configuration, according to the electronic apparatus of one embodiment, it is possible to efficiently dissipate heat that is generated by the electronic component that is mounted on the one surface of the first mounting portion.

Moreover, the driving component may be mounted on one surface (for example, an upper surface) of the second mounting portion, and a surface (for example, a lower surface) of the second mounting portion opposite to the surface on which the driving component is mounted may be exposed from the sealing resin. With this configuration, according to the electronic apparatus of one embodiment, it is possible to efficiently dissipate heat that is generated by the driving component that is mounted on the one surface of the second mounting portion.

According to one aspect of the electronic apparatus disclosed in the present application, it is possible to realize high-speed driving of the electronic component.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic apparatus comprising:

a first metal layer that includes a first mounting portion and a second mounting portion;

a component mounting substrate that includes a wiring board and an electronic component that is mounted on the wiring board, the electronic component being mounted on the first mounting portion;

a second metal layer that is bonded to a driving component and that is arranged on the first metal layer such that the second metal layer and the second mounting portion sandwich the driving component; and sealing resin that fills a space between the first metal layer and the second metal layer, covers the component mounting substrate, and seals the electronic component and the driving component, wherein the first metal layer includes a terminal portion that protrudes from the first mounting portion toward the second metal layer, the second metal layer includes a wire portion that comes into contact with the terminal portion and electrically connects the second metal layer to the first mounting portion, the first metal layer includes another terminal portion that protrudes from the second mounting portion toward the second metal layer along a side edge of the second mounting portion, and the second metal layer includes another wire portion that comes into contact with the other terminal portion and electrically connects the second metal layer to the second mounting portion.

2. The electronic apparatus according to claim 1, wherein the first mounting portion and the second mounting portion are separated from each other via a slit.

3. The electronic apparatus according to claim 2, wherein the terminal portion is arranged along a side edge of the first mounting portion that is adjacent to the slit.

4. The electronic apparatus according to claim 1, wherein the terminal portion is covered by the sealing resin.

5. The electronic apparatus according to claim 1, wherein the electronic component is mounted on one surface of the first mounting portion, and a surface of the first mounting portion opposite to the surface on which the electronic component is mounted is exposed from the sealing resin.

6. The electronic apparatus according to claim 1, wherein the driving component is mounted on one surface of the second mounting portion, and a surface of the second mounting portion opposite to the surface on which the driving component is mounted is exposed from the sealing resin.

* * * * *